United States Patent

Sato

(10) Patent No.: US 8,975,973 B2
(45) Date of Patent: Mar. 10, 2015

(54) OSCILLATION FREQUENCY ADJUSTING APPARATUS, OSCILLATION FREQUENCY ADJUSTING METHOD, AND WIRELESS COMMUNICATION APPARATUS

(75) Inventor: Junji Sato, Tokyo (JP)

(73) Assignee: Panasonic Corporation, Osaka (JP)

( * ) Notice: Subject to any disclaimer, the term of this patent is extended or adjusted under 35 U.S.C. 154(b) by 76 days.

(21) Appl. No.: 13/816,288

(22) PCT Filed: Feb. 9, 2012

(86) PCT No.: PCT/JP2012/000890
§ 371 (c)(1),
(2), (4) Date: Feb. 11, 2013

(87) PCT Pub. No.: WO2012/127770
PCT Pub. Date: Sep. 27, 2012

(65) Prior Publication Data
US 2013/0141143 A1 Jun. 6, 2013

(30) Foreign Application Priority Data
Mar. 24, 2011 (JP) .................. 2011-066286

(51) Int. Cl.
*H03B 27/00* (2006.01)
*H03B 19/00* (2006.01)
(52) U.S. Cl.
CPC .. *H03L 7/00* (2013.01); *H03L 7/16* (2013.01); *H03L 7/24* (2013.01)
USPC ...... 331/55; 331/47; 331/50; 331/2; 331/172; 331/53
(58) Field of Classification Search
CPC ........ H03B 19/00; H03B 19/14; H03B 19/10; H03B 19/06; H03B 27/00; H03B 5/12; H03B 5/1206; H03L 7/24
USPC ............ 331/46, 55, 50, 51, 53, 48, 172, 119, 331/120, 122, 116
See application file for complete search history.

(56) References Cited

U.S. PATENT DOCUMENTS

| | | | |
|---|---|---|---|
| 6,937,107 B2 * | 8/2005 | Ravi et al. | 331/47 |
| 7,557,664 B1 * | 7/2009 | Wu | 331/51 |

(Continued)

FOREIGN PATENT DOCUMENTS

| | | |
|---|---|---|
| JP | 02-025114 A | 1/1990 |
| JP | 11-125669 A | 11/1999 |

(Continued)

OTHER PUBLICATIONS

Lui et al., "5-GHz CMOS Radio Transceiver Front-End Chipset", Solid-State Circuits, IEEE Journal of 35.12 (2000): 1927-1933.*

(Continued)

*Primary Examiner* — Ryan Johnson
(74) *Attorney, Agent, or Firm* — Seed IP Law Group PLLC

(57) ABSTRACT

A voltage controlled oscillation circuit oscillates at an oscillation frequency corresponding to a control voltage. Injection locked oscillation circuits oscillate at an oscillation frequency corresponding to an output signal from the voltage controlled oscillation circuit. A mixer circuit performs a frequency conversion based on output signals from the injection locked oscillation circuits. A synchronization determiner determines the synchronous status between the injection locked oscillation circuits in accordance with an output signal from the mixer circuit. The injection locked oscillation circuits synchronize with each other at a frequency that is an integral multiple of the oscillation frequency of the voltage controlled oscillation circuit.

6 Claims, 9 Drawing Sheets

(56) References Cited

U.S. PATENT DOCUMENTS

2004/0036538 A1 2/2004 Devries et al.
2009/0206894 A1 8/2009 Wang et al.

FOREIGN PATENT DOCUMENTS

| JP | 2005-536095 A | 11/2005 |
| JP | 2006-094333 A | 4/2006 |
| JP | 2010-273283 A | 12/2010 |

OTHER PUBLICATIONS

Asada, H., et al., "A 60 GHz CMOS Integrated Direct-Conversion Transmitter," Proceedings of the 2011 IEICE General Conference, Electronics 2, Feb. 28, 2011, p. 84.

Hara, S., et al., "60 GHz Injection Locked Frequency Quadrupler with Quadrature Outputs in 65 nm CMOS Process," Asia Pacific Microwave Conference, pp. 2268-2271, Dec. 2009.

International Search Report, mailed Apr. 3, 2012, for International Application No. PCT/JP2012/000890, 4 pages.

* cited by examiner

OSCILLATION FREQUENCY ADJUSTING APPARATUS, OSCILLATION FREQUENCY ADJUSTING METHOD, AND WIRELESS COMMUNICATION APPARATUS

TECHNICAL FIELD

The present invention relates to an oscillation frequency adjusting apparatus and an oscillation frequency adjusting method, which adjust an oscillation frequency of an oscillator circuit used in a wireless communication apparatus in a high frequency band, and the wireless communication apparatus.

An RF (radio frequency) circuit has been increasingly transformed into an MMIC (monolithic microwave integrated circuit) in a wireless communication apparatus using a millimeter wave frequency band. For the purpose of commercializing the wireless communication apparatus using the millimeter wave frequency band, a reduction in the power consumption is required for the RF circuit in the wireless communication apparatus. For that reason, it is said that the application of a direct conversion system is effective.

The general direct conversion system needs an oscillator circuit that outputs the same frequency as a carrier frequency, and a PLL (phase locked loop) synthesizer that stabilizes the oscillation frequency. In the frequency band (to several GHz) of the microwave, the oscillator circuit that outputs the same frequency as the carrier frequency, and the PLL can be relatively easily realized (for example, refer to Patent literature 1).

FIG. 8 is a schematic configuration diagram of a conventional PLL synthesizer in Patent Literature 1. The PLL synthesizer illustrated in FIG. 8 includes a reference oscillator 201, a phase frequency detector 203, a charge pump 204, a loop filter 205, a voltage controlled oscillator (VCO) 206, and a frequency divider 207 that divides a frequency of the voltage controlled oscillator 206.

The operation of the PLL synthesizer illustrated in FIG. 8 will be described. A reference signal output from the reference oscillator 201 is input to the phase frequency detector 203. The phase frequency detector 203 compares the reference signal with a frequency component obtained by dividing an oscillation frequency of the voltage controlled oscillator 206 into 1/M through the frequency divider 207, and drives the charge pump 204 according to a phase difference thereof. An output signal of the charge pump 204 is smoothed by the loop filter 205, and applied to the voltage controlled oscillator as a control voltage of the voltage controlled oscillator 206.

When a phase of an output signal of the frequency divider 207 is delayed with respect to the reference signal, or when the frequency is low, an output voltage of the loop filter 205 increases. As a result, the oscillation frequency of the voltage controlled oscillator 206 becomes high, and the phase is advanced so as to match the phase of the reference signal.

However, when the oscillator circuit that outputs the frequency of the frequency band (for example, 60 GHz) of the millimeter wave is manufactured by a CMOS process, the variation of at least one of a process, an ambient temperature, and a supply voltage makes it difficult to manufacture a frequency divider circuit that divides a signal of 60 GHz. For that reason, it is difficult to use a conventional PLL synthesizer in the oscillator circuit that outputs the frequency of the frequency band (for example, 60 GHz) of the millimeter wave.

For example, there has been proposed an oscillator circuit including an injection locked oscillator circuit and a PLL, which can operate in a frequency band sufficiently lower than the millimeter wave frequency band. The oscillator circuit allows the injection locked oscillator circuit and the PLL to be injection locked to a signal of a high-order harmonic of a low frequency, and outputs the frequency of the millimeter wave frequency band (for example, refer to Nonpatent Literature 1).

FIG. 9 is an illustrative view illustrating an internal configuration of a conventional oscillator circuit 109 disclosed in Nonpatent Literature 1. As illustrated in FIG. 9, the conventional oscillator circuit 109 includes a PLL synthesizer 101 and an injection locked oscillator circuit 107.

The PLL synthesizer 101 includes an oscillator circuit 102, a frequency divider circuit 103, a phase frequency detector (PFD: phase frequency detector) 104, a charge pump (CP: charge pump) 105, and a low pass filter (LPF: low pass filter) 106.

The operation of the conventional oscillator circuit 109 will be described.

The oscillator circuit 102 oscillates by 1/M of a desired frequency, with the use of a control voltage input from the low pass filter 106. The frequency divider circuit 103 divides an output signal of the oscillator circuit 102 by N. The phase frequency detector 104 compares a signal N-divided by the frequency divider circuit 103 with the reference signal in phase and frequency.

The charge pump 105 converts a comparison result of the phase frequency detector 104 into a voltage, and outputs the voltage to the low pass filter 106. The low pass filter 106 smooths the voltage output from the charge pump 105. An output of the low pass filter 106 becomes the control voltage of the oscillator circuit 102, and the PLL synthesizer 101 operates by 1/M of a desired frequency.

The injection locked oscillator circuit 107 is injection locked to an M-order harmonic signal of an oscillation frequency output from the PLL synthesizer 101, oscillates by the frequency of a desired frequency, and outputs a signal having a desired frequency.

For example, when the desired frequency is 60 GHz, and the oscillation frequency of the PLL synthesizer 101 is ¼ of the desired frequency, the PLL synthesizer 101 operates at about 15 GHz, and the injection locked oscillator circuit 107 is injection locked to a fourth-order harmonic signal. As a result, the oscillator circuit 109 can output a signal of 60 GHz. Also, because the frequency divider circuit 103 has only to divide the frequency component of 15 GHz, the stable PLL synthesizer 101 can be provided.

CITATION LIST

Patent Literature

Patent Literature 1: U.S. Patent Publication No. 2009/0206894

Nonpatent Literature

Nonpatent Literature: Shoichi Hara., et al., "60 GHz Injection Locked Frequency Quadrupler with Quadrature Outputs in 65 nm CMOS Process", Asia Pacific Microwave Conference, pp. 2268-2271, December 2009

SUMMARY OF THE INVENTION

Problems to be Solved by the Invention

However, the oscillation frequency output from the injection locked oscillator circuit 107 fluctuates due to the variation of at least one of the process, the ambient temperature, and the supply voltage in the injection locked oscillator circuit 107 of the above-mentioned Nonpatent Literature 1.

Further, in order to confirm whether the injection locked oscillator circuit 107 outputs a signal having the desired frequency or not, by the injection locking of the high-order harmonic signal of the PLL synthesizer 101, there is a need to monitor the output signal of the injection locked oscillator circuit 107.

Incidentally, the oscillator circuit 109 disclosed in the above-mentioned Nonpatent Literature 1 has no function for monitoring the output signal of the injection locked oscillator circuit 107. For that reason, when the oscillator circuit 109 is incorporated into a wireless communication apparatus, it is difficult to determine whether the signal of the desired frequency in transmission and reception is appropriately output or not.

The present invention has been made in view of the circumstances of the above-mentioned conventional art, and aims at providing an oscillation frequency adjusting apparatus, an oscillation frequency adjusting method, and a wireless communication apparatus, which control the synchronization of the voltage controlled oscillator circuit and the injection locked oscillator circuit, and output a signal having a desired frequency.

Means for Solving the Problems

According to the present invention, there is provided the above-mentioned oscillation frequency adjusting apparatus, including: a voltage controlled oscillator circuit that oscillates at an oscillation frequency corresponding to a control voltage; a first injection locked oscillator circuit that oscillates at an oscillation frequency corresponding to an output signal from the voltage controlled oscillator circuit; a second injection locked oscillator circuit that oscillates at an oscillation frequency corresponding to the output signal from the voltage controlled oscillator circuit; a mixer circuit that conducts frequency conversion by using an output signal of the first injection locked oscillator circuit, and an output signal of the second injection locked oscillator circuit; and a synchronization determiner that determines synchronous states of the first injection locked oscillator circuit and the second injection locked oscillator circuit according to an output signal of the mixer circuit, in which the first injection locked oscillator circuit and the second injection locked oscillator circuit synchronize with each other at a frequency which is an integral multiple of the oscillation frequency of the voltage controlled oscillator circuit.

Also, according to the present invention, there is provided the above-mentioned oscillation frequency adjusting method, including the steps of: oscillating at an oscillation frequency corresponding to a control voltage; oscillating at a first oscillation frequency higher than the oscillation frequency in synchronization with a high-order harmonic of the oscillation frequency corresponding to the control voltage; oscillating at a second oscillation frequency higher than the oscillation frequency in synchronization with the high-order harmonic of the oscillation frequency corresponding to the control voltage; conducting frequency conversion based on an output signal of the first oscillation frequency and an output signal of the second oscillation frequency; and determining synchronous states of the output signal of the first oscillation frequency and the output signal of the second oscillation frequency according to the output signal of the frequency conversion, in which each of the first oscillation frequency and the second oscillation frequency is an integral multiple of the oscillation frequency corresponding to the control voltage.

Further, according to the present invention, there are provided the above-mentioned oscillation frequency adjusting apparatus; a transmitter mixer circuit that conducts frequency conversion based on a first output signal from the first injection locked oscillator circuit in the oscillation frequency adjusting apparatus, and a transmit baseband signal; and a receiver mixer circuit that conducts frequency conversion based on a second output signal from the second injection locked oscillator circuit in the oscillation frequency adjusting apparatus, and a high frequency receive signal.

Advantageous Effects of the Invention

According to the present invention, the synchronization of the voltage controlled oscillator circuit and the injection locked oscillator circuit can be controlled to output a signal having a desired frequency.

BRIEF DESCRIPTION OF THE DRAWINGS

FIG. 3 is illustrative views illustrating an example of an amplitude characteristic of an output signal of a mixer circuit in the oscillation frequency adjusting apparatus, in which FIG. 3A illustrates the amplitude characteristic in an synchronous state, and FIG. 3B illustrates the amplitude characteristic in an asynchronous state.

MODE FOR CARRYING OUT THE INVENTION

Figure 4:
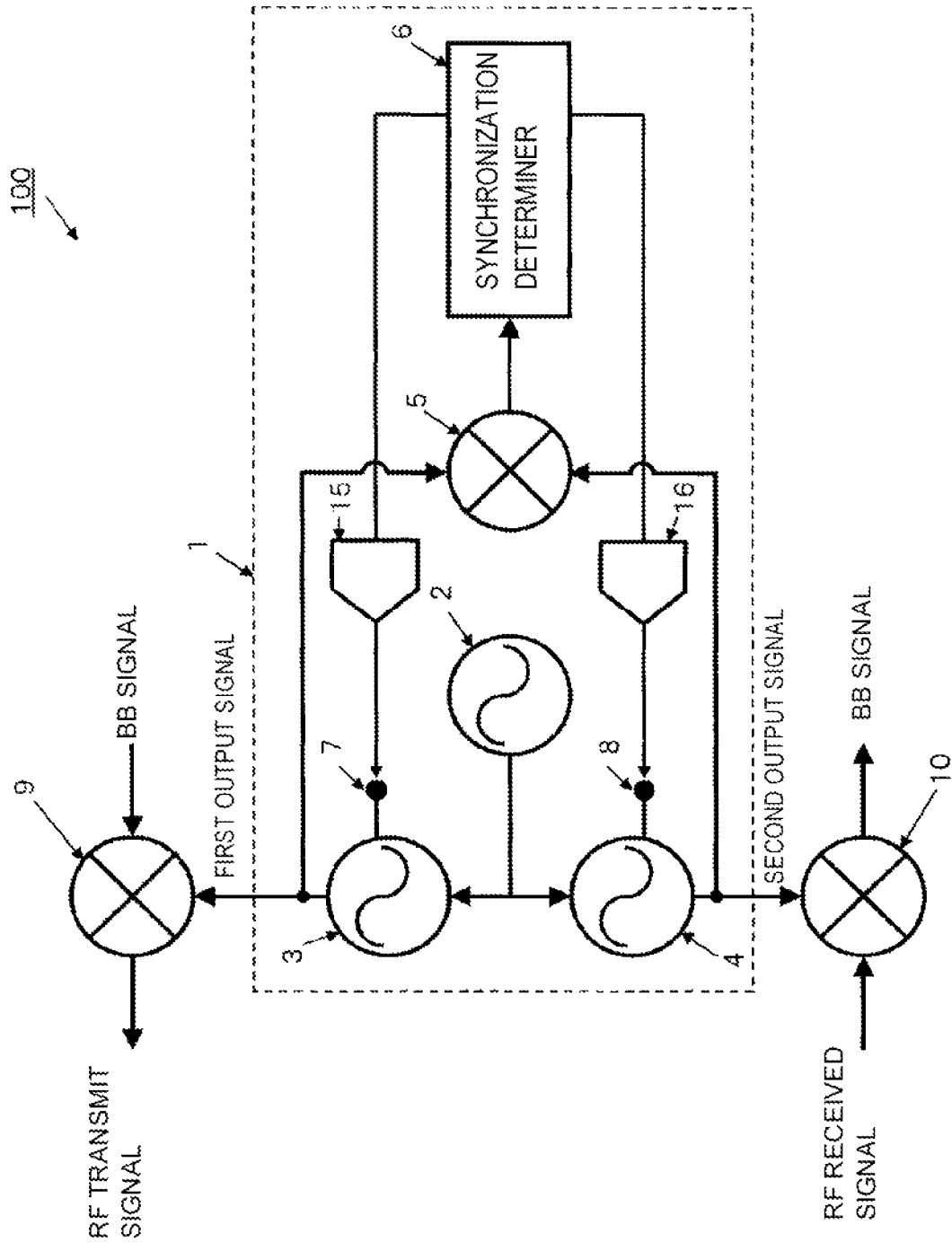
FIG. 4 is a schematic configuration diagram of a wireless communication apparatus including the oscillation frequency adjusting apparatus.

Hereinafter, an oscillation frequency adjusting apparatus according to embodiments of the present invention will be described with reference to the drawings. Also, the present invention can express processing (steps) of the oscillation frequency adjusting apparatus as an oscillation frequency adjusting method. Further, the present invention can be expressed as a wireless communication apparatus into which the oscillation frequency adjusting apparatus is incorporated, as illustrated in FIG. 4 which will be described later.

First Embodiment

Figure 1:
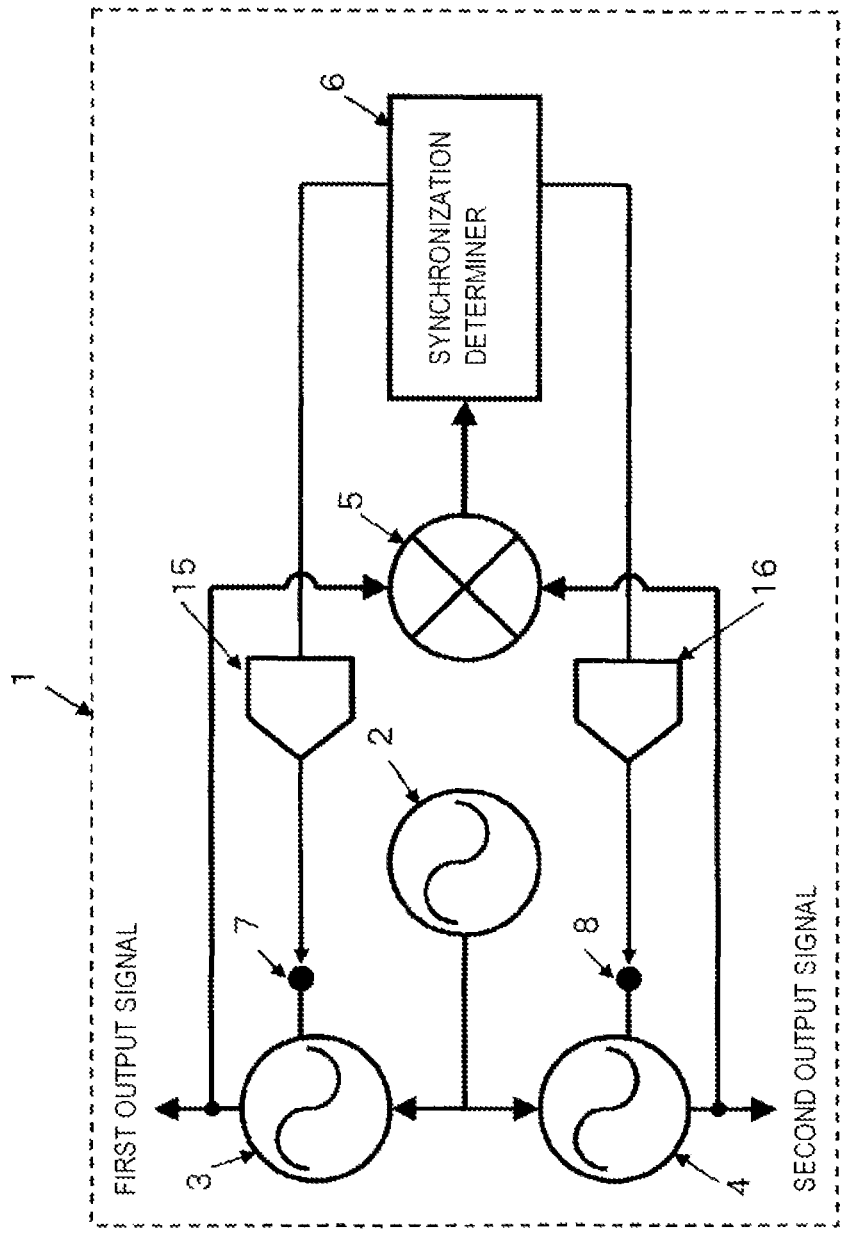
FIG. 1 is an illustrative view illustrating an internal configuration of an oscillation frequency adjusting apparatus according to a first embodiment.

FIG. 1 is an illustrative view illustrating an internal configuration of an oscillation frequency adjusting apparatus 1 according to a first embodiment. As illustrated in FIG. 1, the oscillation frequency adjusting apparatus 1 includes a voltage controlled oscillator circuit 2, injection locked oscillator circuits 3, 4, a mixer circuit 5, a synchronization determiner 6, and AD converters 15, 16.

The injection locked oscillator circuit 4 has a control terminal 7 for adjusting an oscillation frequency of the injection locked oscillator circuit 3. The injection locked oscillator circuit 4 has a control terminal 8 for adjusting the oscillation frequency of the injection locked oscillator circuit 4.

Hereinafter, an output signal of the injection locked oscillator circuit 3 is described as "first output signal", and an output signal of the injection locked oscillator circuit 4 is described as "second output signal".

The operation of the oscillation frequency adjusting apparatus 1 will be described.

The voltage controlled oscillator circuit 2 oscillates at a frequency close to an oscillation frequency $f_0$ based on a control voltage, and outputs an output signal caused by oscillation nearly at the oscillation frequency $f_0$ to the respective injection locked oscillator circuits 3 and 4. Mathematical Expression (1) is satisfied between the oscillation frequency $f_0$ and an oscillation frequency $f_1$ band of the injection locked oscillator circuits 3 and 4.

Figure 9:
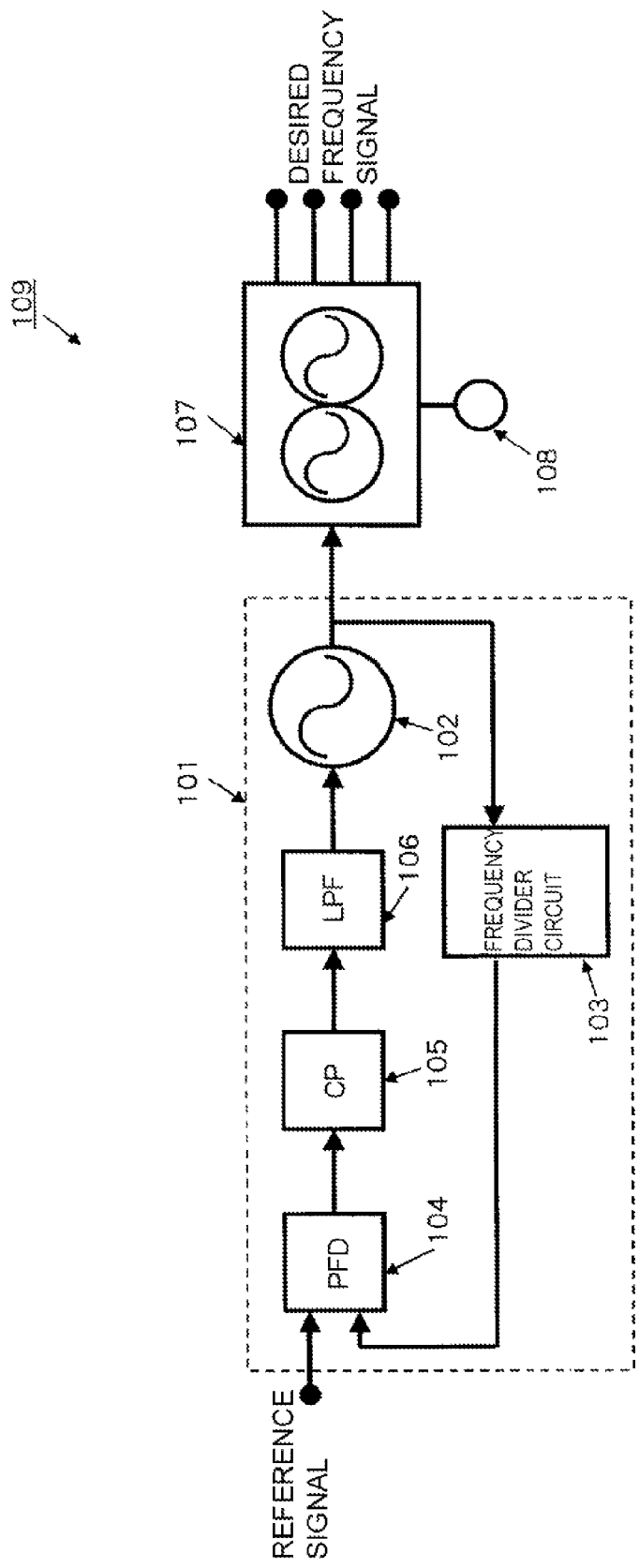
FIG. 9 is an illustrative view illustrating an internal configuration of a conventional oscillator circuit.

The voltage controlled oscillator circuit 2 can be configured, for example, as the oscillator circuit 102 of the PLL synthesizer 101 illustrated in FIG. 9. Although being not illustrated in FIG. 1, the oscillation frequency adjusting apparatus 1 includes the PLL synthesizer 101 of FIG. 9. The voltage controlled oscillator circuit 2 corresponds to the oscillator circuit 102 of FIG. 9. Accordingly, the voltage controlled oscillator circuit 2 oscillates nearly at the oscillation frequency $f_0$ based on a control voltage from a low pass filter not shown in FIG. 1.

[Ex. 1]

$$f_0 = f_1/N \quad (1)$$

The injection locked oscillator circuit 3 synchronizes with an injection (input) of an N-order harmonic signal having the oscillation frequency in the output signal from the voltage controlled oscillator circuit 2, and stably oscillates at a frequency close to the oscillation frequency $f_1$ by synchronization. The injection locked oscillator circuit 3 outputs an output signal caused by oscillation nearly at the oscillation frequency $f_1$ as the first output signal to the mixer circuit 5. As will be described later, the first output signal is also output to a transmit mixer 9.

The injection locked oscillator circuit 4 synchronizes with the injection (input) of the N-order harmonic signal having the oscillation frequency in the output signal from the voltage controlled oscillator circuit 2, and stably oscillates at the frequency close to the oscillation frequency $f_1$ by synchronization. The injection locked oscillator circuit 4 outputs the output signal caused by oscillation nearly at the oscillation frequency $f_1$ as the second output signal to the mixer circuit 5. As will be described later, the second output signal is also output to a receive mixer 10.

In the injection locked oscillator circuits 3 and 4, because a process variation is present in a CMOS process, even if the injection locked oscillator circuits 3 and 4 are configured by the same oscillator, the respective oscillation frequencies are slightly different from each other depending on an installation location in the CMOS process. Further, because the respective injection locked oscillator circuits 3 and 4 oscillate at a free running frequency, the oscillation phases of the respective injection locked oscillator circuits 3 and 4 are also different from each other.

Accordingly, when it is assumed that a frequency component of a first output signal $y_1$ is $\omega_1$, a phase thereof is $\theta_1$, and an amplitude thereof is $a_1$, Mathematical Expression (2) is satisfied. Likewise, when it is assumed that a frequency component of a second output signal $y_2$ is $\omega_2$, a phase thereof is $\theta_2$, and an amplitude thereof is $a_2$, Mathematical Expression (3) is satisfied.

[Ex. 2]

$$y_1 = a_1 \cos(\omega_1 t + \theta_1) \quad (2)$$

[Ex. 3]

$$y_2 = a_2 \cos(\omega_2 t + \theta_2) \quad (3)$$

When the oscillator circuit is manufactured by using the CMOS process, the oscillation frequency of the voltage controlled oscillator circuit 2 fluctuates due to the variation of the process, the ambient temperature, or the supply voltage.

For the purpose of adjusting the oscillation frequencies of the injection locked oscillator circuits 3 and 4, the injection locked oscillator circuit 3 is equipped with the control terminal 7, and the injection locked oscillator circuit 4 is equipped with the control terminal 8. Accordingly, the oscillation frequencies of the injection locked oscillator circuits 3 and 4 can be adjusted by controlling a control voltage Vt to be applied to the control terminals 7 and 8.

Figure 2:
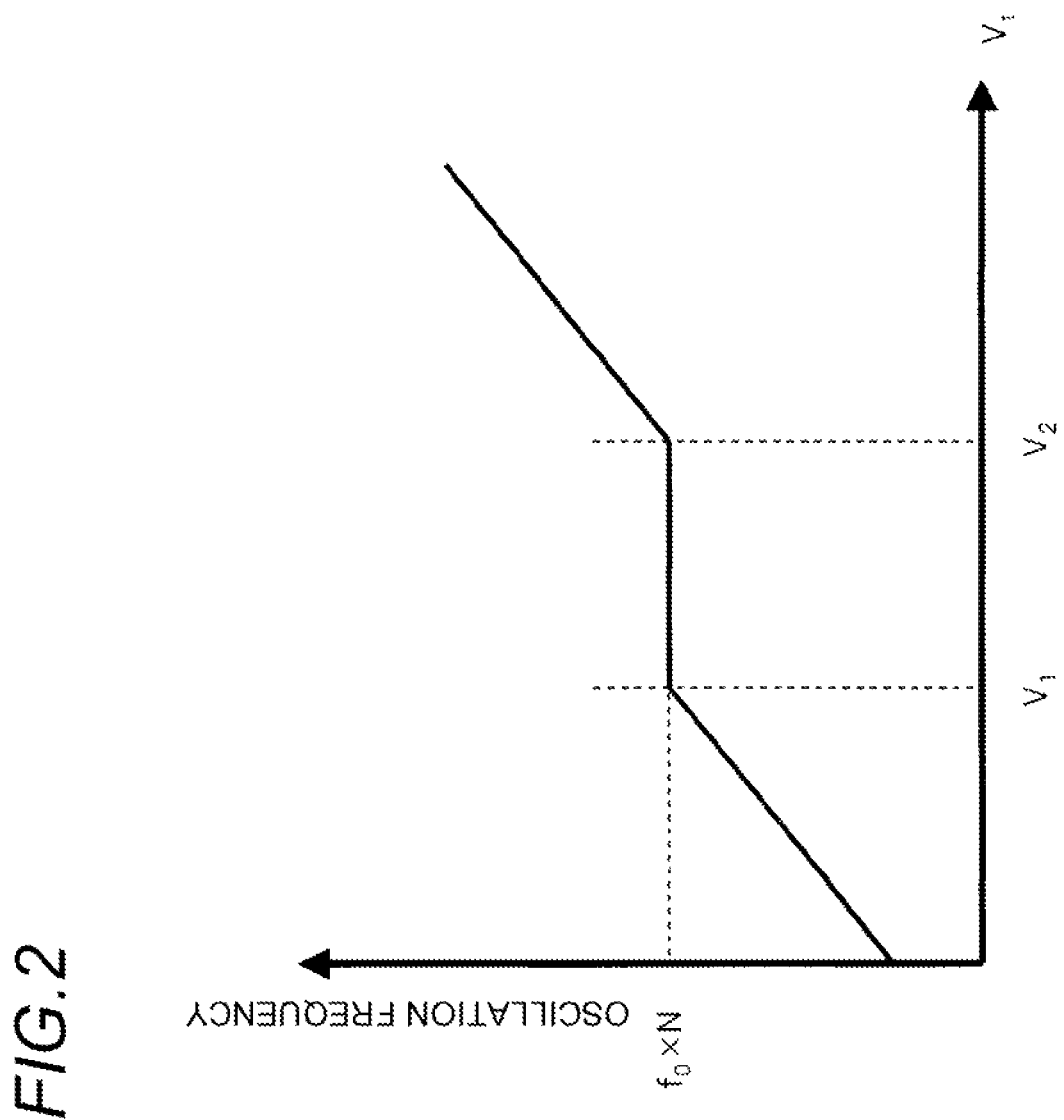
FIG. 2 is an illustrative view illustrating an example of an oscillation frequency characteristic to a control voltage to be applied to each injection locked oscillator circuit in the oscillation frequency adjusting apparatus.

FIG. 2 is an illustrative view illustrating an example of an oscillation frequency characteristic to a control voltage $V_t$ to be applied to the respective injection locked oscillator circuits 3 and 4 in the oscillation frequency adjusting apparatus 1.

As illustrated in FIG. 2, if the control voltage $V_t$ of the injection locked oscillator circuits 3 and 4 is between $V_1$ and $V_2$, the oscillation frequencies of the injection locked oscillator circuits 3 and 4 oscillate in synchronization with N times (N-order harmonic) of the oscillation frequency $f_0$ of the voltage controlled oscillator circuit 2.

If the control voltage $V_t$ of the injection locked oscillator circuits 3 and 4 is not between $V_1$ and $V_2$, the injection locked oscillator circuits 3 and 4 oscillate at the free running frequency out of synchronization with the oscillation frequency $f_0$ of the voltage controlled oscillator circuit 2.

The mixer circuit 5 receives the respective output signals (first output signal $y_1$, second output signal $y_2$) from the injection locked oscillator circuits 3 and 4. The mixer circuit 5 outputs a difference signal between the first output signal and the second output signal based on the respective input output signals.

Specifically, the mixer circuit 5 conducts down conversion by using the first output signal $y_1$ and the second output signal $y_2$ represented by Mathematical Expressions (2) and (3) to output a difference signal $y_3$ represented by Mathematical Expression (4).

[Ex. 4]

$$\begin{aligned} y_3 &= y_1 - y_2 \\ &= a_1 \cos(\omega_1 t + \partial_1) - a_2 \cos(\omega_2 t + \partial_2) \\ &= \frac{a_1 a_2}{2} \{\cos((\omega_1 + \omega_2)t + \partial_1 + \partial_2) + \cos((\omega_1 - \omega_2)t + \partial_1 - \partial_2)\} \end{aligned} \quad (4)$$

In Mathematical Expression (4), $\cos((\omega_1+\omega_2)t+\theta_1+\theta_2)$ represents a component of a sum of the respective frequencies of the first output signal $y_1$ and the second output signal $y_2$, and is a frequency component of about twice of the desired oscillation frequency $f_1$ in the output signals of the injection locked oscillator circuits 3 and 4.

The desired oscillation frequency $f_1$ is, for example, a frequency (60 GHz) of the millimeter wave. Accordingly, it is conceivable that a signal power of the output signal of $\cos((\omega_1+\omega_2)t+\theta_1+\theta_2)$ is sufficiently as small as the signal power can be ignored as compared with a signal power of the output signal of $\cos((\omega_1-\omega_2)t+\theta_1-\theta_2)$.

In Mathematical Expression (4), $\cos((\omega_1-\omega_2)t+\theta_1-\theta_2)$ represents a component of a difference of the respective frequencies of the first output signal $y_1$ and the second output signal $y_2$, and is a lower-order frequency component than the desired oscillation frequency $f_1$ in the output signals of the injection locked oscillator circuits 3 and 4.

The synchronization determiner 6 determines whether the injection locked oscillator circuits 3 and 4 synchronize with the output signal of the voltage controlled oscillator circuit 2 or not, based on the difference signal $y_3$ between the injection locked oscillator circuits 3 and 4, which is output from the mixer circuit 5.

Figure 3:
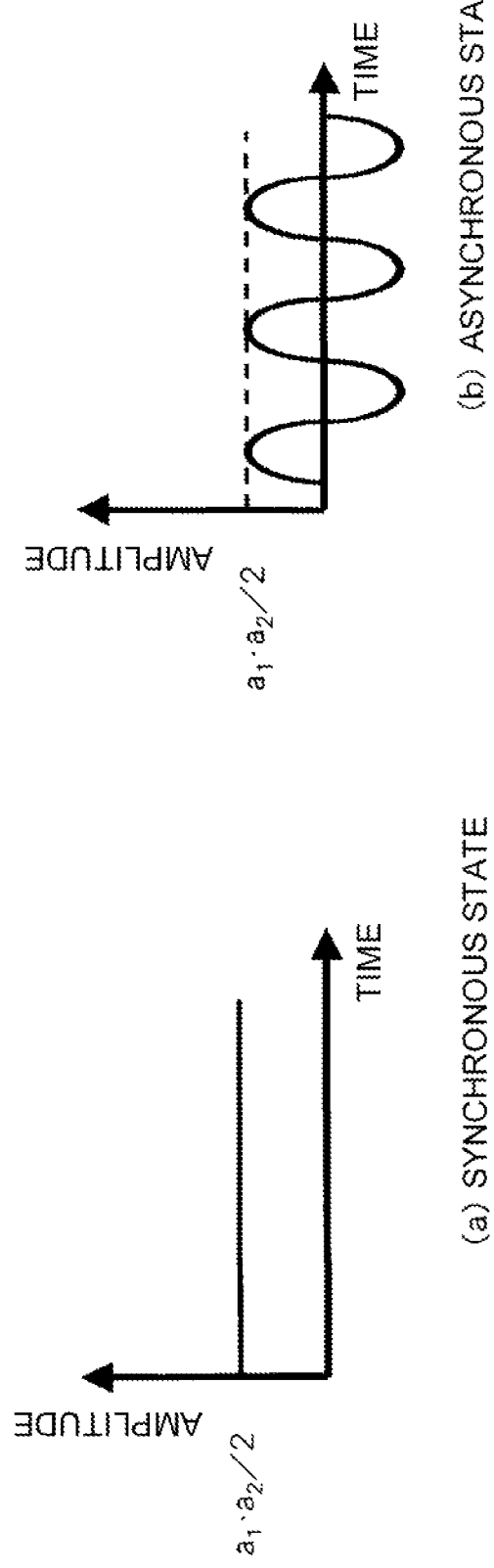

FIG. 3 is illustrative views illustrating an example of an amplitude characteristic of the output signal of the mixer circuit 5 in the oscillation frequency adjusting apparatus 1. FIG. 3A is an illustrative view illustrating an example of the amplitude characteristic in a synchronous state, and FIG. 3B is an illustrative view illustrating an example of the amplitude characteristic in an asynchronous state.

Specifically, when the difference signal $y_3$ is a signal (refer to FIG. 3A) of a DC (direct current) component including no frequency component, the synchronization determiner 6 determines that the injection locked oscillator circuits 3 and 4 synchronize with the output signal of the voltage controlled oscillator circuit 2.

The synchronization determiner 6 outputs a voltage control signal corresponding to a determination result indicative of whether the injection locked oscillator circuits 3 and 4 synchronize with the output signal of the voltage controlled oscillator circuit 2 or not, to the AD converters 15 and 16.

For example, if the injection locked oscillator circuits 3 and 4 do not synchronize with the output signal of the voltage controlled oscillator circuit 2, a voltage control signal corresponding to the determination result of the synchronization determiner 6 is a control signal for increasing or decreasing the control voltage to the injection locked oscillator circuits 3 and 4.

For example, if the injection locked oscillator circuits 3 and 4 synchronize with the output signal of the voltage controlled oscillator circuit 2, the voltage control signal corresponding to the determination result of the synchronization determiner 6 is a control signal for maintaining the control voltage to the injection locked oscillator circuits 3 and 4 at a present control voltage.

If the injection locked oscillator circuits 3 and 4 synchronize with the output signal of the voltage controlled oscillator circuit 2, the frequency $\omega_1=\omega_2$ and the phase $\theta_1=\theta_2$ are satisfied, and $\cos((\omega_1-\omega_2)t+\theta_1-\theta_2)$ in Mathematical Expression (4) becomes $\cos(0)=1$. The output signal (difference signal $y_3$) of the mixer circuit 5 becomes a DC component including no frequency component as illustrated in FIG. 3A.

Also, if the difference signal $y_3$ is a signal (refer to FIG. 3B) including the frequency component, the synchronization determiner 6 determines that the injection locked oscillator circuits 3 and 4 do not synchronize with the output signal of the voltage controlled oscillator circuit 2.

If the injection locked oscillator circuits 3 and 4 do not synchronize with the output signal of the voltage controlled oscillator circuit 2, the frequency $\omega_1=\omega_2$ and the phase $\theta_1=\theta_2$ are not satisfied. The output signal (difference signal $y_3$) of the mixer circuit 5 is a signal corresponding to a difference $(\omega_1-\omega_2)t$ of the frequency components, as illustrated in FIG. 3B.

In this example, the injection locked oscillator circuits 3 and 4 are affected by the variation of the process, but used as local signal sources to the transmit mixer 9 and the receive mixer 10, respectively. For that reason, the two injection locked oscillator circuits 3 and 4 are not arranged at a long distance therebetween on the CMOS. FIG. 4 is a schematic configuration diagram of a wireless communication apparatus 100 including the oscillation frequency adjusting apparatus 1.

Accordingly, the two injection locked oscillator circuits 3 and 4 do not synchronize with the output signal of the voltage controlled oscillator circuit 2 in a state where the injection locked oscillator circuits 3 and 4 oscillate at the free running frequency (state other than a voltage between the control voltages $V_1$ to $V_2$ in FIG. 2). However, it is conceivable that the oscillation frequencies of the output signals of the respective injection locked oscillator circuits 3 and 4 are not largely deviated from each other, and the respective oscillation frequencies are close to each other.

The AD converter 15 receives the voltage control signal output from the synchronization determiner 6. The AD converter 15 generates a control voltage to be applied to the control terminal 7 of the injection locked oscillator circuit 3 based on the input voltage control signal. The AD converter 15 applies the generated control voltage to the control terminal 7 of the injection locked oscillator circuit 3.

The AD converter 16 receives the voltage control signal output from the synchronization determiner 6. The AD converter 16 generates a control voltage to be applied to the control terminal 8 of the injection locked oscillator circuit 4 based on the input voltage control signal. The AD converter 16 applies the generated control voltage to the control terminal 8 of the injection locked oscillator circuit 4.

The same control voltage $V_t$ is applied to each of the control terminal 7 of the injection locked oscillator circuit 3 and the control terminal 8 of the injection locked oscillator circuit 4 whereby the oscillation frequencies of the output signals of the injection locked oscillator circuits 3 and 4 become substantially identical with each other. In fact, the respective oscillation frequencies are different from each other.

That is, if it is determined that the injection locked oscillator circuit 3 does not synchronize with the output signal of the voltage controlled oscillator circuit 2, the AD converter 15 applies a control voltage obtained by increasing or decreasing the present control voltage $V_t$ of the injection locked oscillator circuit 3 by a predetermined amount, to the control terminal 7.

Likewise, if it is determined that the injection locked oscillator circuit 4 does not synchronize with the output signal of the voltage controlled oscillator circuit 2, the AD converter 16 applies a control voltage obtained by increasing or decreasing the present control voltage $V_t$ of the injection locked oscillator circuit 4 by a predetermined amount, to the control terminal 8.

The predetermined amounts by which the AD converters 15 and 16 increase or decrease the control voltage are identical with each other.

As a method of increasing the control voltage, for example, a default of the control voltage $V_t$ is set to a minimum control voltage in advance, and the AD converters 15 and 16 gradually increase the control voltages to the control terminals 7 and 8 based on the voltage control signal corresponding to the determination result of the synchronization determiner 6.

As a method of decreasing the control voltage, for example, the default of the control voltage $V_t$ is set to a maximum control voltage in advance, and the AD converters 15 and 16 gradually decrease the control voltages to the control terminals 7 and 8 based on the voltage control signal corresponding to the determination result of the synchronization determiner 6.

If the control voltage $V_t$ applied to the control terminals 7 and 8 ranges from the control voltages $V_1$ to $V_2$ illustrated in FIG. 2, the injection locked oscillator circuits 3 and 4 synchronize with the output signal of the voltage controlled oscillator circuit 2.

Accordingly, if the injection locked oscillator circuits 3 and 4 do not synchronize with the output signal of the voltage controlled oscillator circuit 2, the oscillation frequency adjusting apparatus 1 automatically calibrates the applied voltages of the injection locked oscillator circuits 3 and 4. According to the oscillation frequency adjusting apparatus 1, the synchronization of the injection locked oscillator circuits 3, 4, and the output signal of the voltage controlled oscillator circuit 2 can be realized by the automatic calibration.

According to the oscillation frequency adjusting apparatus 1, because the synchronization of the injection locked oscillator circuits 3, 4, and the output signal of the voltage controlled oscillator circuit 2 can be calibrated, no shipping inspection is required, and the oscillator of the millimeter wave band can be inexpensively configured.

As a result, the oscillation frequency adjusting apparatus 1 can supply a local signal of the frequency component, which is always stable, to the transmit mixer 9 and the receive mixer 10 as the oscillator of a local signal.

Further, according to the oscillation frequency adjusting apparatus 1 the synchronous status of the injection locked oscillator circuit can be determined by a simple method, and a local oscillation signal using the injection locked oscillator circuit can be generated even in a super high frequency band such as the frequency of the millimeter wave. Hence, the wireless communication apparatus 100 (refer to FIG. 4) including the oscillation frequency adjusting apparatus 1 can conduct a stable and high reliable wireless communication.

In the first embodiment, the synchronization determiner 6 determines whether the injection locked oscillator circuits 3 and 4 synchronize with the voltage controlled oscillator circuit 2 or not, according to whether the output signal of the mixer circuit 5 includes the frequency component or not.

As a determination method in the synchronization determiner 6, the following method may be applied. For example, the synchronization determiner 6 integrates the DC components of the difference signal $y_3$ output from the mixer circuit 5 in a predetermined period. The predetermined period is a time corresponding to a ½ cycle or one cycle of the difference signal $y_3$.

If an integrated value in the predetermined period exceeds a predetermined threshold value, the synchronization determiner 6 determines that the injection locked oscillator circuits 3 and 4 synchronize with the output signal of the voltage controlled oscillator circuit 2. If the integrated value in the predetermined period does not exceed the predetermined threshold value, the synchronization determiner 6 determines that the injection locked oscillator circuits 3 and 4 does not synchronize with the output signal of the voltage controlled oscillator circuit 2.

Figure 5:
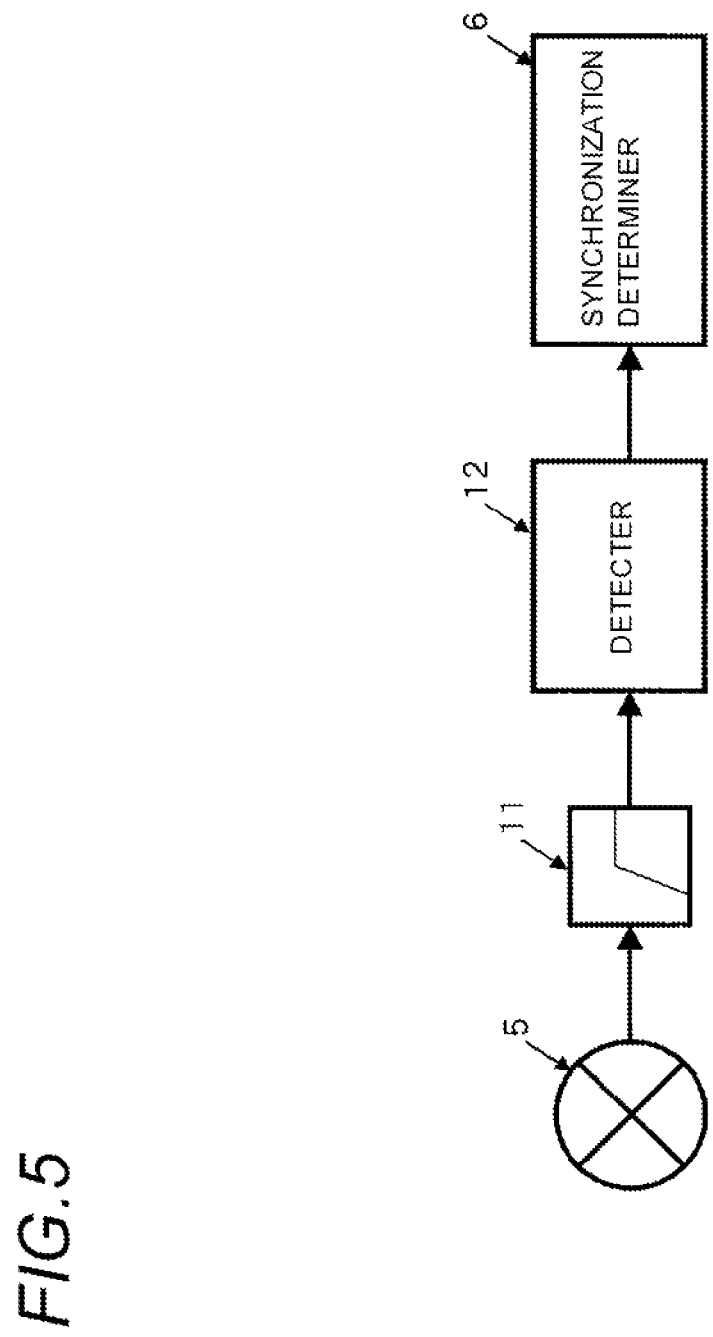
FIG. 5 is an illustrative view illustrating an example in which an output signal of a mixer circuit is monitored in the oscillation frequency adjusting apparatus.

Also, another determination method in the synchronization determiner 6 will be described with reference to FIG. 5. FIG. 5 is an illustrative view illustrating an example in which an output signal of the mixer circuit 5 is monitored in the oscillation frequency adjusting apparatus 1. Referring to FIG. 5, the oscillation frequency adjusting apparatus 1 includes a high pass filter 11 and a detector 12 between the mixer circuit 5 and the synchronization determiner 6.

As illustrated in FIG. 5, after the DC component of the difference signal $y_3$ has been removed from the output signal (difference signal $y_3$) of the mixer circuit 5 by the high pass filter 11, a signal power of a difference signal from which the DC component has been removed is detected by the detector 12.

When the difference signal is detected as an output of the detector 12, the synchronization determiner 6 determines that the injection locked oscillator circuits 3 and 4 do not synchronize with the output signal of the voltage controlled oscillator circuit 2.

When the difference signal is not detected as the output of the detector 12, the synchronization determiner 6 determines that the injection locked oscillator circuits 3 and 4 synchronize with the output signal of the voltage controlled oscillator circuit 2.

Also, in the first embodiment, the output signals of the injection locked oscillator circuits 3 and 4 are input directly to the mixer circuit 5. A buffer amplifier may be equipped between each of the injection locked oscillator circuits 3 and 4, and the mixer circuit 5. With this configuration, because an absolute value of the signal power of the output signal (difference signal) from the mixer circuit 5 becomes large, the synchronization determiner 6 can determine whether the injection locked oscillator circuits 3 and 4 synchronize with the output signal of the voltage controlled oscillator circuit 2 or not, with high precision.

Also, a buffer amplifier may be further disposed between the mixer circuit 5 and the synchronization determiner 6. With this configuration, because the signal power of the output signal from the mixer circuit 5 is amplified by the buffer amplifier, the synchronization determiner 6 can determine whether the injection locked oscillator circuits 3 and 4 synchronize with the output signal of the voltage controlled oscillator circuit 2 or not, with high precision.

Also, in the first embodiment, the AD converters 15 and 16 are connected to the injection locked oscillator circuits 3 and 4, respectively, but the voltage control signal to be input to the AD converters 15 and 16, and the control voltage to be output therefrom are identical with each other. Accordingly, for example, the two AD converters 15 and 16 are not provided, but a single AD converter 15 may be provided, and the output of the AD converter 15 may be branched into two, and input to the control terminals 7 and 8. As a result, only one AD converter 15 can be provided, and the circuit of the oscillation frequency adjusting apparatus 1 can be downsized, and the power consumption can be reduced.

Second Embodiment

Figure 6:
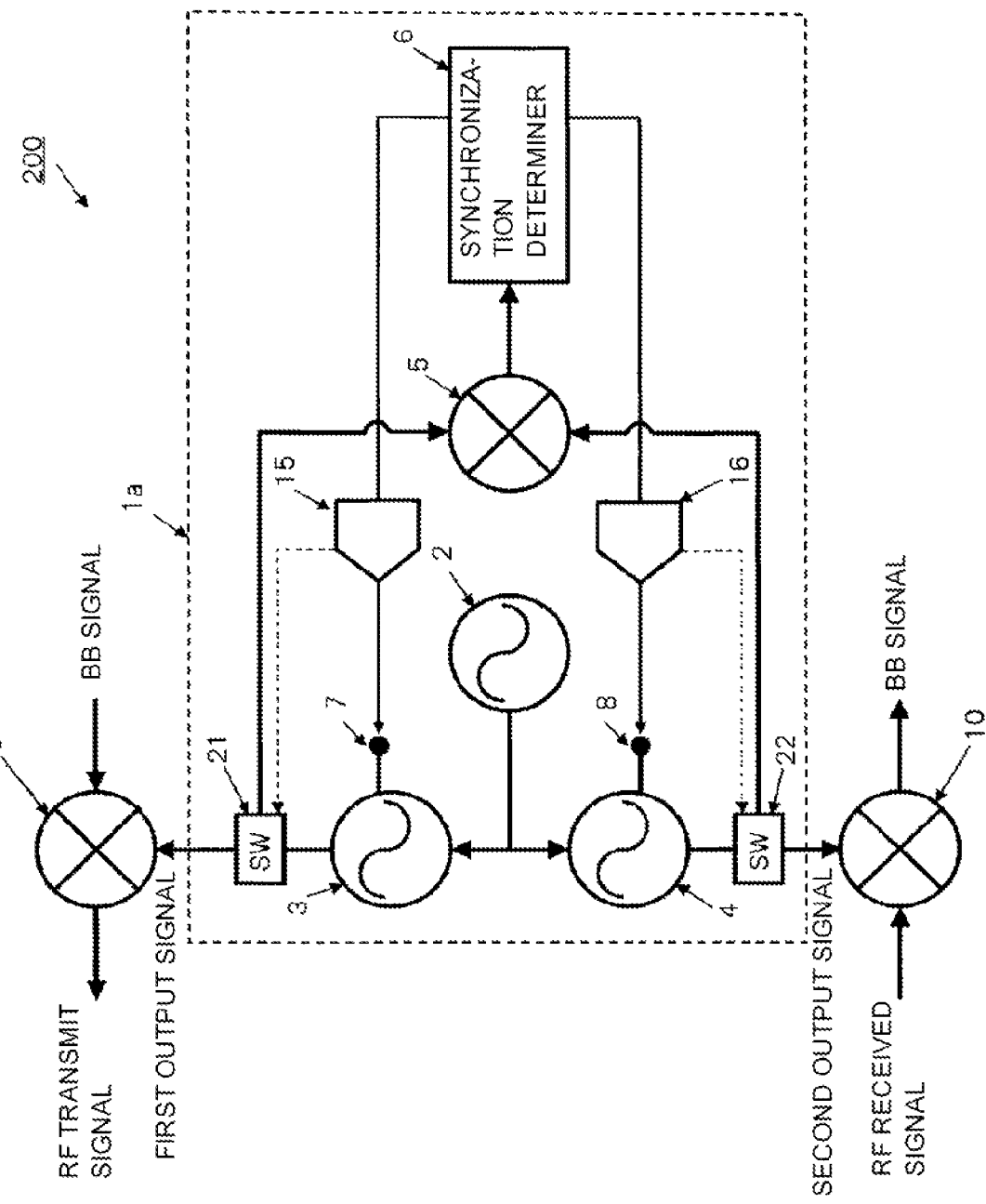
FIG. 6 is an illustrative view illustrating an internal configuration of an oscillation frequency adjusting apparatus according to a second embodiment.

FIG. 6 is an illustrative view illustrating an internal configuration of an oscillation frequency adjusting apparatus 1a according to a second embodiment. As illustrated in FIG. 6, the oscillation frequency adjusting apparatus 1a includes a voltage controlled oscillator circuit 2, injection locked oscillator circuits 3, 4, a mixer circuit 5, a synchronization determiner 6, AD converters 15, 16, and switches 21, 22.

The switch 21 switches an electric continuity between the injection locked oscillator circuit 3 and the mixer circuit 5, or between the injection locked oscillator circuit 3 and the transmit mixer 9. The switching of the switch 21 can be controlled, for example, according to a control voltage $V_{sw}$ output from the AD converter 15 or a switching control unit not shown. Hereinafter, it is assumed that the switch 21 is controlled according to the control voltage $V_{sw}$ output from the AD converter 15.

When the injection locked oscillator circuit 3 does not synchronize with the output signal of the voltage controlled oscillator circuit 2, the switch 21 establishes the electric continuity between the injection locked oscillator circuit 3 and the mixer circuit 5 according to the control voltage $V_{sw}$ output from the AD converter 15.

While the injection locked oscillator circuit 3 synchronizes with the output signal of the voltage controlled oscillator circuit 2, the switch 21 establishes the electric continuity between the injection locked oscillator circuit 3 and the transmit mixer 9, for example, according to the control voltage $V_{sw}$ output from the AD converter 15.

As a result, the output signal of the injection locked oscillator circuit 3 is input to not the mixer circuit 5 but the transmit mixer 9 while the injection locked oscillator circuit 3 oscillates with the output signal of the voltage controlled oscillator circuit 2.

The switch 22 switches an electric continuity between the injection locked oscillator circuit 4 and the mixer circuit 5, or between the injection locked oscillator circuit 4 and the receive mixer 10. The switching of the switch 22 can be controlled, for example, according to the control voltage $V_{sw}$ output from the AD converter 16 or a switching control unit not shown. Hereinafter, it is assumed that the switch 22 is controlled according to the control voltage $V_{sw}$ output from the AD converter 16.

When the injection locked oscillator circuit 4 does not synchronize with the output signal of the voltage controlled oscillator circuit 2, the switch 22 establishes the electric continuity between the injection locked oscillator circuit 4 and the mixer circuit 5 according to the control voltage $V_{sw}$ output from the AD converter 16.

While the injection locked oscillator circuit 4 synchronizes with the output signal of the voltage controlled oscillator circuit 2, the switch 22 establishes the electric continuity between the injection locked oscillator circuit 4 and the receive mixer 10, for example, according to the control voltage $V_{sw}$ output from the AD converter 16.

As a result, the output signal of the injection locked oscillator circuit 4 is input to not the mixer circuit 5 but the receive mixer 10 while the injection locked oscillator circuit 4 oscillates with the output signal of the voltage controlled oscillator circuit 2.

The operation of the oscillation frequency adjusting apparatus 1a will be described.

The description of the same operation as the operation described in the first embodiment will be omitted. In this example, the operation different from that in the first embodiment will be described.

A wireless communication apparatus 200 including the oscillation frequency adjusting apparatus 1a does not start a communication until it is determined that the injection locked oscillator circuits 3 and 4 synchronize with the output signal of the voltage controlled oscillator circuit 2.

The switches 21 and 22 establishes the electric continuity between the injection locked oscillator circuits 3, 4, and the mixer circuit 5 in order to input the output signals of the injection locked oscillator circuits 3 and 4 to the mixer circuit 5, according to the control voltage $V_{sw}$, in an initial state (before a communication starts).

The oscillation frequency adjusting apparatus 1a determines that the injection locked oscillator circuits 3 and 4 are synchronized with the output signal of the voltage controlled oscillator circuit 2 by automatic calibration described in the first embodiment, under the initial state of the switches 21 and 22.

Thereafter, the switch 21 establishes the electric continuity between the injection locked oscillator circuit 3 and the transmit mixer 9 according to the control voltage $V_{sw}$ applied by the AD converter 15. As a result, the output signal of the injection locked oscillator circuit 3 can be input to the transmit mixer 9.

Likewise, the switch 22 establishes the electric continuity between the injection locked oscillator circuit 4 and the receive mixer 10 according to the control voltage $V_{sw}$ applied by the AD converter 16. As a result, the output signal of the injection locked oscillator circuit 4 can be input to the receive mixer 10.

As described above, in the second embodiment, the switches 21 and 22 are provided to the outputs of the injection locked oscillator circuits 3 and 4. Hence, the wireless communication apparatus 200 including the oscillation frequency adjusting apparatus 1a controls the switches 21 and 22 in order to input the respective output signals of the injection locked oscillator circuits 3 and 4 to the mixer circuit 5 before the communication starts (before the automatic calibration is finished).

After the automatic calibration has been finished, the wireless communication apparatus 200 including the oscillation frequency adjusting apparatus 1a controls the switches 21 and 22 in order to input the respective output signals of the injection locked oscillator circuits 3 and 4 to the transmit mixer 9 and the receive mixer 10.

That is, the oscillation frequency adjusting apparatus 1a can increase the output signal of the mixer circuit 5 because all of the respective output signals of the injection locked oscillator circuits 3 and 4 are input to the mixer circuit 5 before the communication starts. As a result, high precision determination can be realized by the synchronization determiner 6.

Also, the output signals of the injection locked oscillator circuits 3 and 4 are not input to the transmit mixer 9 and the receive mixer 10 before the automatic calibration is finished, that is, until the injection locked oscillator circuits 3 and 4 synchronize with the output signal of the voltage controlled oscillator circuit 2. The output signals of the injection locked oscillator circuits 3 and 4 are not input to the transmit mixer 9 and the receive mixer 10 until the injection locked oscillator circuits 3 and 4 synchronize with the output signal of the voltage controlled oscillator circuit 2. As a result, the wireless communication apparatus 200 including the oscillation frequency adjusting apparatus 1a can conduct the communication with a high quality.

Also, in the second embodiment, the output signals of the injection locked oscillator circuits 3 and 4 are input directly to the mixer circuit 5. A buffer amplifier may be further disposed between each of the injection locked oscillator circuits 3, 4, and the mixer circuit 5. As a result, because an absolute value of the signal power of the output signal (difference signal) from the mixer circuit 5 becomes large, the synchronization determiner 6 can determine whether the injection locked oscillator circuits 3 and 4 synchronize with the output signal of the voltage controlled oscillator circuit 2 or not, with high precision.

Also, a buffer amplifier may be further disposed between the mixer circuit 5 and the synchronization determiner 6. With this configuration, because the signal power of the output signal from the mixer circuit 5 is amplified by the buffer amplifier, the synchronization determiner 6 can determine whether the injection locked oscillator circuits 3 and 4 synchronize with the output signal of the voltage controlled oscillator circuit 2 or not, with high precision.

Third Embodiment

Figure 7:
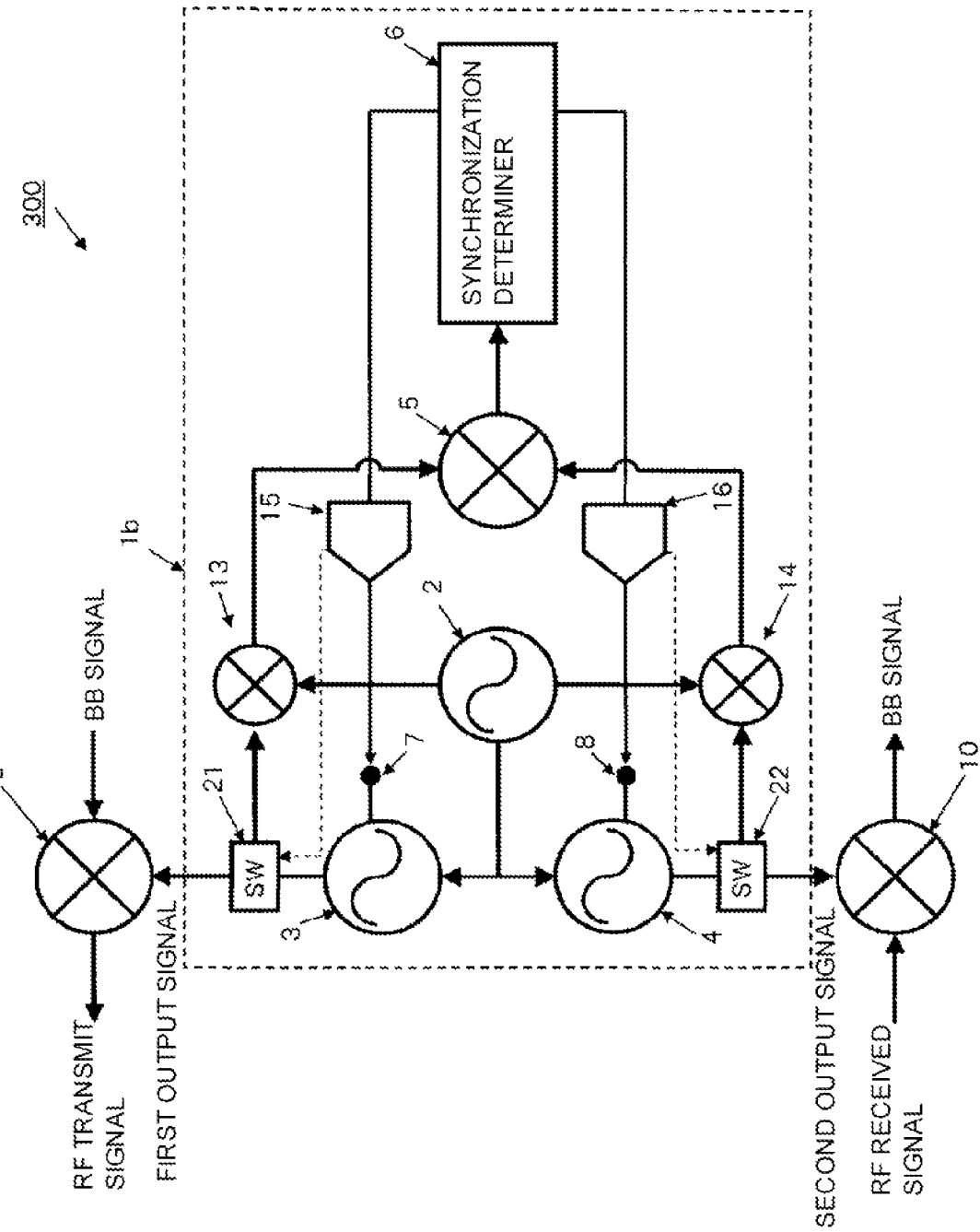
FIG. 7 is an illustrative view illustrating an internal configuration of an oscillation frequency adjusting apparatus according to a third embodiment.
Figure 8:
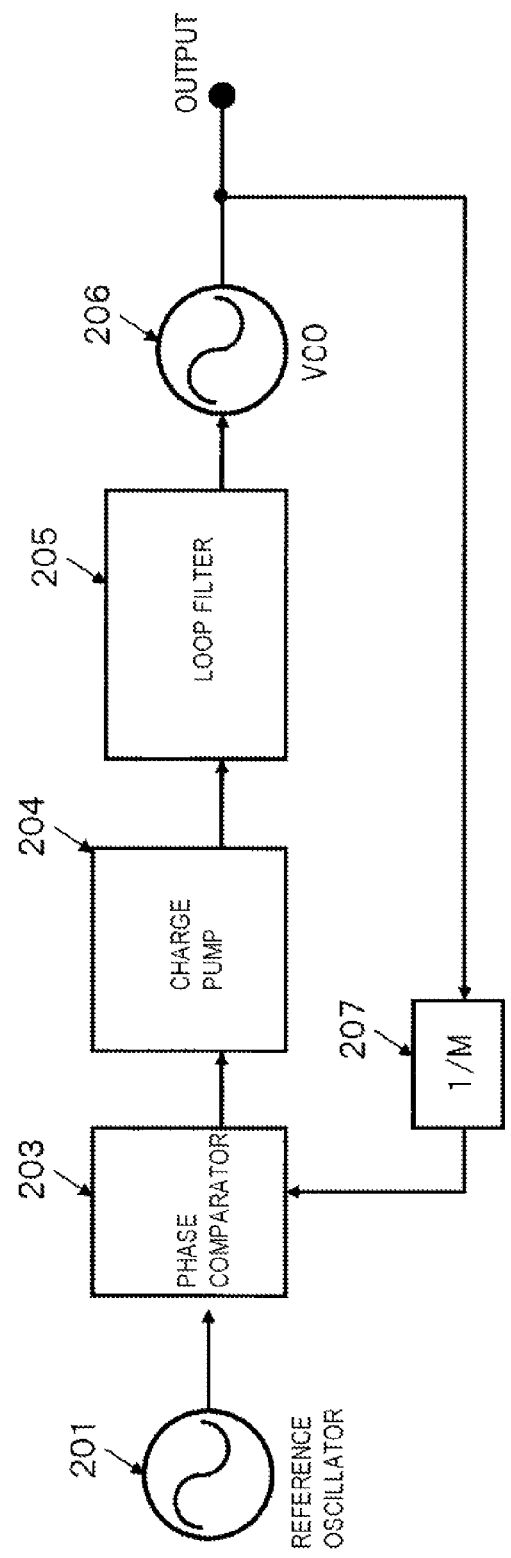
FIG. 8 is a schematic configuration diagram of a conventional PLL synthesizer.

FIG. 7 is an illustrative view illustrating an internal configuration of an oscillation frequency adjusting apparatus 1b according to a third embodiment. As illustrated in FIG. 7, the oscillation frequency adjusting apparatus 1b includes a voltage controlled oscillator circuit 2, injection locked oscillator circuits 3, 4, a mixer circuit 5, a synchronization determiner 6, AD converters 15, 16, switches 21, 22, and intermediate frequency mixer circuits 13, 14.

The description of the same operation as the operation described in the first embodiment will be omitted. In this example, the operation different from that in the first embodiment will be described.

As illustrated in FIG. 7, the output signals of the injection locked oscillator circuits 3 and 4 are input to the intermediate frequency mixer circuits 13 and 14 through switches 21 and 22, respectively.

The intermediate frequency mixer circuit 13 receives the output signal of the injection locked oscillator circuit 3 and the output signal of the voltage controlled oscillator circuit 2 when the electric continuity between the injection locked oscillator circuit 3 and the mixer circuit 5 is established by the switch 21.

The intermediate frequency mixer circuit 13 conducts down conversion based on the received output signal of the voltage controlled oscillator circuit 2 and the received output signal of the injection locked oscillator circuit 3, and outputs a difference signal between the output signal of the injection locked oscillator circuit 3 and the output signal of the voltage controlled oscillator circuit 2 to the mixer circuit 5.

The intermediate frequency mixer circuit 14 receives the output signal of the injection locked oscillator circuit 4 and the output signal of the voltage controlled oscillator circuit 2 when the electric continuity between the injection locked oscillator circuit 4 and the mixer circuit 5 is established by the switch 22.

The intermediate frequency mixer circuit 14 conducts down conversion based on the received output signal of the voltage controlled oscillator circuit 2 and the received output signal of the injection locked oscillator circuit 4, and outputs a difference signal between the output signal of the injection locked oscillator circuit 4 and the output signal of the voltage controlled oscillator circuit 2 to the mixer circuit 5.

The mixer circuit 5 receives the difference signals output from the intermediate frequency mixer circuits 13 and 14. Each frequency of the difference signals is a frequency obtained by subtracting the oscillation frequency $f_0$ of the output signal of the voltage controlled oscillator circuit 2 from each oscillation frequency of the output signals of the injection locked oscillator circuits 3 and 4.

The mixer circuit 5 can conduct the frequency conversion represented by Mathematical Expression (4) with the use of a frequency lower than the oscillation frequencies of the injection locked oscillator circuits 3 and 4. As a result, the mixer circuit 5 can be used in a status in which the operation capability of a transistor specifically configuring the mixer circuit 5 is higher, and the output signal of the mixer circuit 5 can be increased. In the oscillation frequency adjusting apparatus 1b, the output signals of the injection locked oscillator circuits 3 and 4 are input to the mixer circuit 5 whereby the mixer circuit 5 stably operates, for example, without using the buffer amplifier.

As described above, according to the oscillation frequency adjusting apparatus 1b, the output level of the mixer circuit 5 can be increased, and the synchronization can be stably determined by the synchronization determiner 6.

The variety of embodiments have been described above with reference to the drawings. However, it is needless to say that the present invention is not limited to the above examples. It would be apparent to an ordinary skilled person that various modifications and corrections could be conducted without departure from the scope of the present invention. Those modifications and corrections are included in a technical scope of the present invention.

The present invention is based on Japanese Patent Application No. 2011-066286 filed on Mar. 24, 2011, and content thereof is incorporated herein by reference.

INDUSTRIAL APPLICABILITY

The present invention is applicable to an oscillation frequency adjusting apparatus, an oscillation frequency adjusting method, and a wireless communication apparatus, which control the synchronization of the voltage controlled oscillator circuit and the injection locked oscillator circuit, and output a signal having a desired frequency.

Also, the present invention is effective as a circuit for generating a local signal (local signal) in the super high frequency band such as the millimeter wave band by configuring a PLL synthesizer by a frequency lower than a desired carrier frequency, and synchronizing the injection locked oscillator circuit with the use of a signal which is an integral multiple of a low frequency.

DESCRIPTION OF REFERENCE NUMERALS AND SIGNS 1, oscillation frequency adjusting apparatus
2, voltage controlled oscillator circuit
3, 4, injection locked oscillator circuit
5, mixer circuit
6, synchronization determiner
7, 8, control terminal
9, transmit mixer
10, receive mixer
13, 14, intermediate frequency mixer circuit
15, 16, AD converter
21, 22, switch

The invention claimed is:

1. An oscillation frequency adjusting apparatus, comprising:
    a voltage controlled oscillator circuit that oscillates at an oscillation frequency corresponding to a control voltage;
    a first injection locked oscillator circuit that oscillates at an oscillation frequency corresponding to an output signal from the voltage controlled oscillator circuit;
    a second injection locked oscillator circuit that oscillates at an oscillation frequency corresponding to the output signal from the voltage controlled oscillator circuit;
    a mixer circuit that conducts frequency conversion based on an output signal of the first injection locked oscillator circuit and an output signal of the second injection locked oscillator circuit; and
    a synchronization determiner that determines synchronous states of the first injection locked oscillator circuit and the second injection locked oscillator circuit according to an output signal of the mixer circuit, wherein the first injection locked oscillator circuit and the second injection locked oscillator circuit are synchronized with each other at a frequency which is an integral multiple of the oscillation frequency of the voltage controlled oscillator circuit, wherein the synchronization determiner determines the respective synchronous states of the first injection locked oscillator circuit and the second injection locked oscillator circuit according to whether the output signal of the mixer circuit includes a frequency component or not.

2. The oscillation frequency adjusting apparatus according to claim 1 further comprising:
a first amplifier that is arranged between the first injection locked oscillator circuit and the mixer circuit; and
a second amplifier that is arranged between the second injection locked oscillator circuit and the mixer circuit.

3. A wireless communication apparatus, comprising:
the oscillation frequency adjusting apparatus according to claim 1;
a transmitter mixer circuit that conducts frequency conversion based on a first output signal from the first injection locked oscillator circuit of the oscillation frequency adjusting apparatus and a transmit baseband signal; and
a receive mixer circuit that conducts frequency conversion based on a second output signal from the second injection locked oscillator circuit of the oscillation frequency adjusting apparatus and a high frequency receive signal.

4. An oscillation frequency adjusting apparatus, comprising:
a voltage controlled oscillator circuit that oscillates at an oscillation frequency corresponding to a control voltage;
a first injection locked oscillator circuit that oscillates at an oscillation frequency corresponding to an output signal from the voltage controlled oscillator circuit;
a second injection locked oscillator circuit that oscillates at an oscillation frequency corresponding to the output signal from the voltage controlled oscillator circuit;
a mixer circuit that conducts frequency conversion based on an output signal of the first injection locked oscillator circuit and an output signal of the second injection locked oscillator circuit; and
a synchronization determiner that determines synchronous states of the first injection locked oscillator circuit and the second injection locked oscillator circuit according to an output signal of the mixer circuit,
wherein the first injection locked oscillator circuit and the second injection locked oscillator circuit are synchronized with each other at a frequency which is an integral multiple of the oscillation frequency of the voltage controlled oscillator circuit,
wherein the synchronization determiner integrates output signals of the mixer circuit in a predetermined period, and determines the respective synchronous states of the first injection locked oscillator circuit and the second injection locked oscillator circuit according to whether an integrated value of the output signals exceeds a predetermined threshold value or not.

5. An oscillation frequency adjusting apparatus, comprising:
a voltage controlled oscillator circuit that oscillates at an oscillation frequency corresponding to a control voltage;
a first injection locked oscillator circuit that oscillates at an oscillation frequency corresponding to an output signal from the voltage controlled oscillator circuit;
a second injection locked oscillator circuit that oscillates at an oscillation frequency corresponding to the output signal from the voltage controlled oscillator circuit;
a mixer circuit that conducts frequency conversion based on an output signal of the first injection locked oscillator circuit and an output signal of the second injection locked oscillator circuit;
a synchronization determiner that determines synchronous states of the first injection locked oscillator circuit and the second injection locked oscillator circuit according to an output signal of the mixer circuit,
a high pass filter that passes a high frequency component in the output signal of the mixer circuit; and
a detector that detects the signal which has passed through the high pass filter,
wherein the first injection locked oscillator circuit and the second injection locked oscillator circuit are synchronized with each other at a frequency which is an integral multiple of the oscillation frequency of the voltage controlled oscillator circuit,
wherein the synchronization determiner determines the respective synchronous states of the first injection locked oscillator circuit and the second injection locked oscillator circuit according to whether the detected output signal of the mixer circuit exceeds a predetermined threshold value or not.

6. An oscillation frequency adjusting method, comprising the steps of:
oscillating at an oscillation frequency corresponding to a control voltage;
oscillating at a first oscillation frequency higher than the oscillation frequency in synchronization with a high-order harmonic of the oscillation frequency corresponding to the control voltage;
oscillating at a second oscillation frequency higher than the oscillation frequency in synchronization with the high-order harmonic of the oscillation frequency corresponding to the control voltage;
conducting the frequency conversion based on an output signal of the first oscillation frequency and an output signal of the second oscillation frequency; and
determining synchronous states of the output signal of the first oscillation frequency and the output signal of the second oscillation frequency according to the output signal of the frequency conversion,
wherein each of the first oscillation frequency and the second oscillation frequency is an integral multiple of the oscillation frequency corresponding to the control voltage,
wherein the synchronous states are determined by the respective synchronous states of the first oscillation frequency and the second oscillation frequency according to whether the output signal of the frequency conversion includes a frequency component or not.

* * * * *